United States Patent
Yoshioka et al.

(10) Patent No.: US 6,677,212 B1
(45) Date of Patent: Jan. 13, 2004

(54) ELEVATED SOURCE/DRAIN FIELD EFFECT TRANSISTOR AND METHOD FOR MAKING THE SAME

(75) Inventors: Fumiyoshi Yoshioka, Fukuyama (JP); Masayuki Nakano, Nara (JP); Hiroshi Iwata, Nara-ken (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/070,478

(22) PCT Filed: Sep. 6, 2000

(86) PCT No.: PCT/JP00/06046
§ 371 (c)(1),
(2), (4) Date: May 2, 2002

(87) PCT Pub. No.: WO01/18877
PCT Pub. Date: Mar. 15, 2001

(30) Foreign Application Priority Data

Sep. 7, 1999 (JP) .......................... 11/252892

(51) Int. Cl.$^7$ ............................................ H01L 27/108
(52) U.S. Cl. ................... 438/303; 438/301; 257/401
(58) Field of Search .................. 438/301, 304, 438/305, 303; 257/401, 368

(56) References Cited

U.S. PATENT DOCUMENTS 5,539,229 A * 7/1996 Noble, Jr et al. ............ 257/301
5,733,792 A * 3/1998 Masuoka ...................... 437/35

FOREIGN PATENT DOCUMENTS

| EP | 0 756 317 A2 | 1/1997 |
| JP | 3-74848 A | 3/1991 |
| JP | 9-191106 A | 7/1997 |
| JP | 10-335660 A | 12/1998 |
| WO | 95/12896 A1 | 5/1995 |

OTHER PUBLICATIONS

Yamakawa et al., IEEE Electron Device Letters, vol. 20, No. 7, pp. 366–368 (1999).

Mazure et al., Facet Engineered Elevated Source/Drain by Selective Si Epitaxy for 0.35 Micron Mosfets, pp. 33.7.1 to 33–.7–.4 (1992).

* cited by examiner

*Primary Examiner*—Richard Elms
*Assistant Examiner*—Brad Smith
(74) *Attorney, Agent, or Firm*—Birch, Stewart, Kolasch & Birch, LLP

(57) ABSTRACT

A gate oxide film (23), a gate electrode (24) and a gate cap insulating film (25) are stacked on an active region of a p-type semiconductor substrate (21), and an insulating side wall (29) is formed, followed by $BF_2$ ion implantation. Thus, a surface of the p-type semiconductor substrate becomes amorphous so that single-crystal silicon is prevented from epitaxially growing in the next process of depositing polysilicon (33). Halo regions (32) are formed using the $BF_2$ ions having the opposite conductivity to a source/drain to reduce the short-channel effect. The substrate is then passed through a nitrogen purge chamber having a dew point kept at –100° C. to remove water molecules completely, and polysilicon (33) is deposited. Because native oxide is prevented from growing at an interface between the active region and the polysilicon, source/drain regions (34) formed later by implantation and diffusion of n-type impurity ions achieve a uniform junction depth.

8 Claims, 4 Drawing Sheets

(a)

(b)

(c)

ELEVATED SOURCE/DRAIN FIELD EFFECT TRANSISTOR AND METHOD FOR MAKING THE SAME

This application is the national phase under 35 U.S.C. §371 of PCT International Application No. PCT/JP00/06046 which has an International filing date of Sep. 6, 2000, which designated the United States of America.

TECHNICAL FIELD

The present invention relates to a method for producing a semiconductor device and a semiconductor device produced by the method. More particularly, it relates to a source/drain elevated type FET (field effect transistor) capable of suppressing a short channel effect and increasing a current drive power, and a production method therefor.

BACKGROUND ART

In recent years, as the gate lengths of MOS (metal oxide semiconductor) FETs get shorter, the so-called short-channel effect represented by rapid lowering of the threshold voltage has become a problem. In order to suppress the short-channel effect, the source/drain regions have been required to have a shallower depth of junction. However, a mere reduction in the depth of the source/drain regions would increase the resistance of these regions. Therefore, a source/drain elevated type transistor wherein source/drain regions are elevated higher than a surface of the substrate has attracted attention. This structure makes it possible to provide the source/drain regions with their junctions being substantially shallow and with their electrical resistances being low.

FIG. 6 shows a process for fabricating a conventional source/drain elevated type transistor. First, as shown in FIG. 6(a), a gate electrode 3 is formed on a semiconductor substrate 1 with an oxide film 2 interposed therebetween, and then a gate cap insulating film 4 is laid thereon according to a conventional process. Then, insulating sidewalls 5 are formed on side surfaces of the gate electrode 3. A reference numeral 6 indicates an element isolation region.

Subsequently, as shown in FIG. 6(b), a silicon film 7 is selectively grown between the sidewall 5 and the element isolation region 6 on the semiconductor substrate 1, so that the silicon films 7, which are to become source/drain regions later, are thereby elevated on the surface of the semiconductor substrate 1. After that, as shown in FIG. 6(c), a source/drain impurity is implanted into the silicon films 7 to form source/drain regions 8. In addition, the impurity is diffused into the silicon substrate 1 by thermal treatment, thus making the source/drain regions 8 present within the semiconductor substrate 1 as well. Thereby, the source/drain elevated type transistor is formed.

However, the conventional source/drain elevated type transistor has the following drawbacks. That is, when forming the source/drain 7 on the surface of the semiconductor substrate 1, single-crystal silicon is epitaxially grown. During the growth, facets 10 are produced at a boundary between the insulating sidewall 5 and the silicon film 7 and at a boundary between the element isolation region 6 and the silicon film 7. Due to the presence of the facets 10, impurities are deeply implanted into both end portions of each source/drain region 8 within the semiconductor substrate 1, as shown in FIG. 6(c), resulting in a problem in that the formation of a shallow junction is very difficult.

Further, surfaces of the elevated source/drain regions are silicified in order to reduce their electrical resistances. In that case, at end portions of the gate electrode where the elevated layers are thin, a silicide is formed even within the semiconductor substrate 1, and thus there is a problem that junction characteristics deteriorate.

As described above, when the source and drain 7 are elevated according to the conventional process, the facets 10 are produced, and thus it is very difficult to form favorable junctions. Then, as a solution to reduce the influence of the facets 10, there is a method by which the facets 10 are filled with polysilicon and the like as disclosed in JP-A-11-74507, for example. However, steps such as deposition of polysilicon and etch back are required. Thus, there is a problem that the production process becomes complicated.

Furthermore, since single-crystal silicon is used for forming the elevated source and drain 7, there are not only the facets 10-related problem but also a problem that, in correspondence with production-attributed variations in the thickness of the single-crystal silicon film 7, there are variations in the junction depths of the source/drain regions 8 in the semiconductor substrate 1. The problem of the variations in the junction depths of the source/drain regions 8, which is attributed to the variations in the thickness of the single-crystal silicon films 7, can be solved by depositing polysilicon in place of single-crystal silicon. This is because polysilicon does not produce a facet during deposition and moreover, the impurity diffusion coefficient of polysilicon is larger than that of single-crystal silicon. Accordingly, the variations in the thickness of the deposited polysilicon film between products hardly affect the junction depths of the source/drain regions.

However, if equipment from which oxygen is sufficiently eliminated is not used in the deposition of polysilicon, a nonuniform native oxide film is produced between the semiconductor substrate and the polysilicon film thus deposited. This native oxide film becomes a diffusion barrier against source/drain impurities implanted later. For that reason, there is a problem that a good junction cannot be obtained. Accordingly, the deposition of silicon must be performed under the condition that oxygen is sufficiently eliminated. However, in the case where oxygen is sufficiently eliminated, without any surface treatment performed on the semiconductor substrate, polysilicon would inherit the crystal orientation of the semiconductor substrate and epitaxially grow, thus causing another problem that a desired polysilicon film cannot be obtained.

DISCLOSURE OF INVENTION

An object of the invention is to provide a method for producing a source/drain elevated type semiconductor device, which method can deposit a polycrystalline conductive film, such as polysilicon, that favors achievement of a shallow source/drain junction depth, and also to provide a semiconductor device produced by the production method.

In order to accomplish the above object, a method for producing a semiconductor device according to the present invention comprises the steps of:

sectioning a surface of a substrate or well region of first conductive type to form an active region and then forming a gate oxide film on the active region;

forming a gate electrode on the gate oxide film;

forming insulating sidewalls on side surfaces of the gate electrode;

implanting ions into a surface of the semiconductor substrate or well region at portions of the active region that are to be source/drain regions, to thereby make these portions amorphous;

depositing a polycrystalline conductive film on the surface of the semiconductor substrate or well region formed with the gate oxide film, the gate electrode and the insulating sidewalls;

performing etch back on the polycrystalline conductive film to form conductive sidewalls on side surfaces of the insulating sidewalls;

implanting high-concentration impurities of second conductive type into the conductive sidewalls; and diffusing the high-concentration impurities of second conductive type into the semiconductor substrate or well region by a thermal treatment to thereby form the source/drain regions.

With the above constitution, since the surfaces of the portions to become the source and drain regions in the active region of the first conductive type semiconductor substrate or well region are made amorphous, a monocrystal conductive film will not epitaxially grow during the deposition of a polycrystal conductive film on the surface of the semiconductor substrate or well region, but a desired polycrystalline conductive film without any facets is deposited. Therefore, in the case where the semiconductor substrate or well region is a single-crystal semiconductor substrate, utilizing the difference between the impurity diffusion coefficient of the polycrystalline conductive film and that of the single-crystal semiconductor allows a uniform junction depth of the source/drain regions in the semiconductor substrate or well region to be set.

In one embodiment, the ions implanted into the surface of the active region are of the first conductive type and at an impurity concentration higher than that of the first conductive type semiconductor substrate or well region.

With the above constitution, when the surface of the semiconductor substrate or well region is made amorphous, the first conductive type ions are implanted at an impurity concentration higher than that of the first conductive type semiconductor substrate or well region. Thus, part of the ion-implanted regions form halo regions. Accordingly, the short-channel effect is suppressed by the halo regions.

Preferably, the deposition of the polycrystalline conductive film may be carried out in an ambient having an oxygen concentration of 1 ppm or lower.

With this constitution, an oxide film is not formed at the interface between the semiconductor substrate or well region and the conductive sidewalls. Thus, when the source/drain regions are formed later, the second conductive type high-concentration impurities are thermally diffused into the semiconductor substrate or well region smoothly. As a result, the junction depth of the source/drain regions in the semiconductor substrate or well region is more uniformly set.

Further, a semiconductor device according to the present invention comprises a gate insulating film and a gate electrode stacked in this order on a substrate or well region of first conductive type, sidewall insulating films disposed on side surfaces of the gate electrode, a channel region formed in the semiconductor substrate or well region beneath the gate electrode, and source/drain regions of second conductive type elevated up to above the semiconductor substrate or well region from both sides of the channel region, the source/drain regions being electrically isolated from the gate electrode by the gate insulating film and the sidewall insulating films, and is characterized in that the semiconductor substrate or well region has diffusion regions of the first conductive type formed between the source/drain regions and the channel region, the diffusion regions having an impurity concentration higher than that of the semiconductor substrate or well region.

The source/drain regions of this semiconductor device are elevated up to above the semiconductor substrate or well region from both the sides of the channel region in the first conductive type semiconductor substrate or well region. Therefore, when implanting the second conductive type high-concentration impurities into the source/drain regions in the formation of the source/drain regions, a shallow junction is formed in the semiconductor substrate or well region.

Furthermore, the first conductive type diffusion layer regions having an impurity concentration higher than that of the semiconductor substrate or well region are present surrounding the source/drain regions. For that reason, extension of a depletion layer is suppressed whereby the short-channel effect is suppressed.

If the impurity concentration of the first conductive type diffusion layer regions falls in the range of $5 \times 10^{17}/cm^3$–$1 \times 10^{19}/cm^3$, more favorable suppression of the short-channel effect is achieved.

In one embodiment, the source/drain regions on the surface of the semiconductor substrate or well region are delimited by element isolation regions, and the elevated source/drain region on the semiconductor substrate or well region has, on an upper side thereof, a length in a transistor gate length direction that is longer than a distance between the sidewall insulating film and the element isolation region.

With this constitution, the capacitance between each of the source/drain regions and the semiconductor substrate or well region is greatly reduced resulting in an improvement in the operation speed.

BEST MODE FOR CARRYING OUT THE INVENTION

Figure 1:
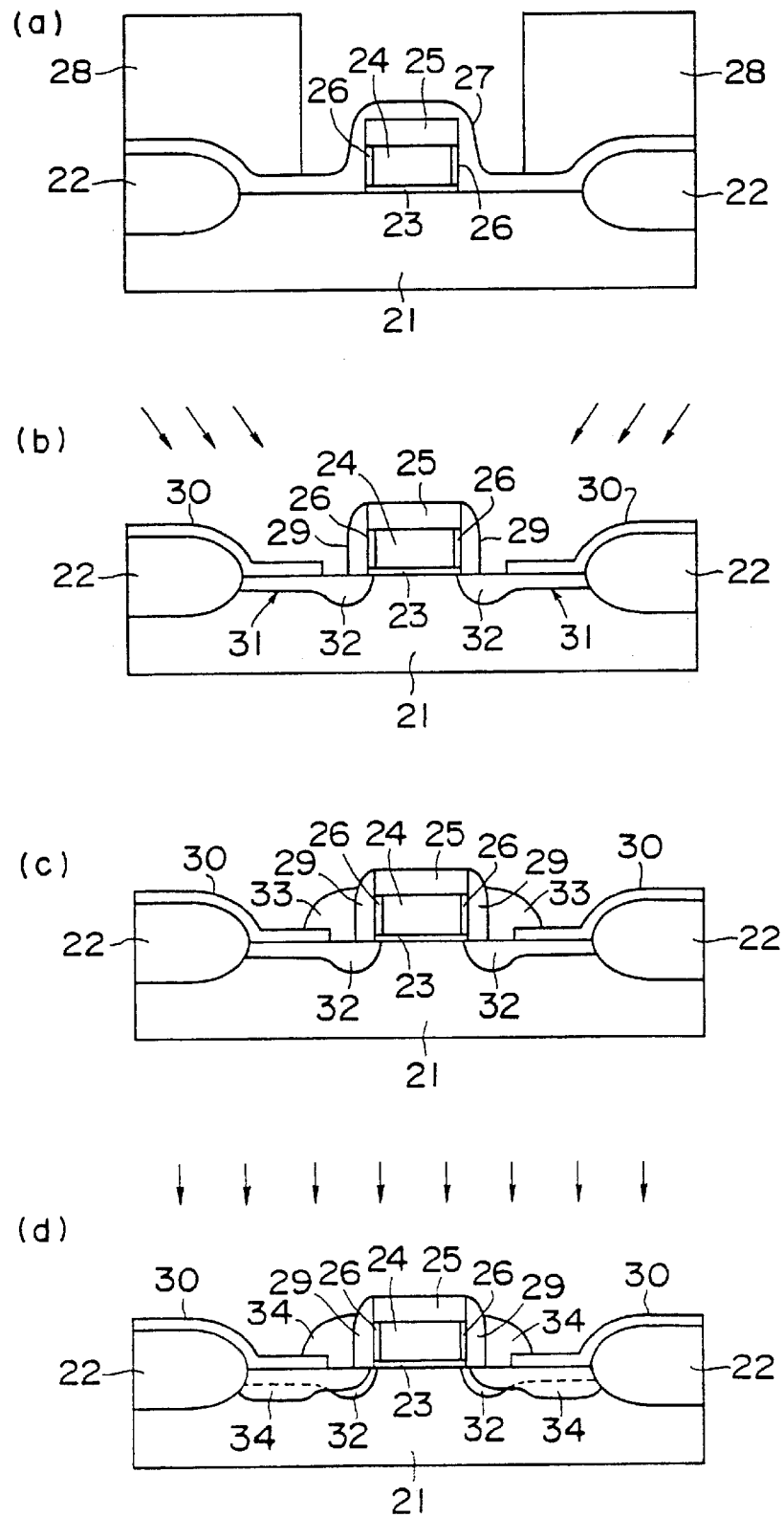
FIG. 1 is a process flow chart which shows one example of the process of producing a semiconductor device of this invention.

This invention will be explained in more detail by way of the following embodiments illustrated in the drawings.

First Embodiment

FIG. 1 shows a process for producing an n-channel MOSFET as a semiconductor device according to the present embodiment. The present embodiment is also applicable to a method of producing a p-channel MOSFET in addition to the n-channel MOSFET. The method of producing an n-channel MOSFET will be hereinafter explained with reference to FIG. 1. Although FIG. 1 and the rest of the drawings are all sectional views, hatching has been omitted to make the drawings simple.

First, as shown in FIG. 1(a), element isolation regions 22 are formed on a p-type semiconductor substrate (silicon substrate) (or a p-type well region of a semiconductor substrate) 21, so that the substrate 21 is sectioned or partitioned to form active regions surrounded by the element isolation regions 22. In a case where the reference numeral 21 denotes not the p-type semiconductor substrate 21 but a p-type well region of a substrate, the p-type well region is formed to a depth of about 1 $\mu$m at an impurity concentration of, for example, 5E16/cm$^3$–1E18/cm$^3$, namely, $5\times10^{16}$/cm$^3$–$1\times10^{18}$/cm$^3$. Further, in a case where a CMOS (complementary metal oxide film semiconductor) is formed using the n-channel MOSFET, a well region having the opposite conductivity to that of source/drain regions may be additionally formed in the p-type semiconductor substrate 21.

After that, a gate oxide film 23 (a nitride oxide film 2.5 nm thick), a gate electrode 24 (a polysilicon film 200 nm high and 0.15 $\mu$m wide [gate length]) and a gate cap insulating film 25 (a silicon oxide film 150 nm thick, which is not limitative) are stacked on the active region in this order. Next, a silicon oxide film 26 having a film thickness of about 10 nm is formed on side surfaces of the gate electrode 24 by oxidation thereof, and then an insulating film 27 made of a silicon nitride film or the like is deposited on the entire surface (to a film thickness of 60 nm). Thereafter, except for the gate region and its proximity, a resist film 28 is formed in order to protect the p-type semiconductor substrate 21 and the element isolation regions 22 from damage due to the following etching process. After that, the insulating film 27 is etched back thereby forming insulating sidewalls 29 and insulating films 30 for protecting the p-type semiconductor substrate 21 and the element isolation regions 22 simultaneously.

In the present example, the gate electrode 24 is formed of polysilicon, but it is not limited to this material. For example, it may be made of a two-layer film consisting of a polysilicon film and a high-melting point metal silicide film, such as titanium silicide, tungsten silicide or cobalt silicide, or a two-layer film consisting of a polysilicon film and a high-melting point metal film, such as tungsten, or a single layer consisting of a high melting-point metal, such as titanium nitride or tungsten.

In the present embodiment, a sidewall insulating film of the gate electrode 24 is formed of a two-layer film consisting of a thermal oxide film (the silicon oxide film 26) and a silicon nitride film (the insulating sidewall 29). The sidewall insulating film of the gate electrode 24 may also be made of a two-layer film consisting of a CVD (chemical vapor deposition) oxide film and a silicon nitride film, a single layer film of a CVD oxide film or a single layer film of a silicon nitride film.

Next, as shown in FIG. 1(b), using the gate electrode 24 as a mask, BF$_2$ ions are implanted so that portions 31 in the p-type silicon substrate, which are to become source/drain regions, are made amorphous. The implantation of BF$_2$ ions having the opposite conductivity to the source and the drain also has a function of forming a halo region 32, which suppresses growth of a depletion layer to reduce the short-channel effect. At this time, BF$_2$ ions are implanted at the angle of inclination of 0–60° C. relative to the silicon substrate with the implantation energy in the range of 5 keV–130 keV such that the resulting halo regions 32 as diffusion layer regions contain the impurity at the concentration of $5\times10^{17}$/cm$^3$–$1\times10^{19}$/cm$^3$.

In the present embodiment, BF$_2$ ions are used in order to make the surface of the p-type semiconductor substrate 21 amorphous, however, the present invention is not limited to this. For example, B ions, In ions, Si ions or Ar ions may also be implanted. However, a B ion is lighter than a BF$_2$ ion. Thus, with implantation of the B ions at an amount just attaining the above impurity concentration, it is difficult to make the surface of the p-type semiconductor substrate amorphous. Therefore, in the case where B ions are used, it is required to implant molecules of large mass, such as Si or Ar ions, before or after the implantation of B ions. The inclination angle and the implantation dose of B ions are the same as in BF$_2$ ions. B ions and In ions are implanted at an energy of 5 keV–30 keV, 5 keV–200 keV, respectively.

Then, polysilicon is deposited on the entire surface of the p-type semiconductor substrate 21 including the portions that have been made amorphous by the implantation of the impurities. In the present embodiment, polysilicon was deposited by a low pressure CVD method in an atmosphere having an oxygen concentration of 1 ppm or lower. As mentioned above, the p-type semiconductor substrate 21 made amorphous by means of the implantation of the impurities prevents a silicon film deposited in this step by the CVD method from growing epitaxially inheriting the crystal orientation of a silicon substrate that is the p-type silicon substrate 21.

If the deposition of polysilicon is attempted without implantation of the above impurities in the silicon substrate 21, then a silicon film grows epitaxially succeeding the crystal orientation of the silicon substrate 21. As a result, the variations in the thickness of the epitaxial film will affect the junction depth because the diffusion rate of the impurities in the epitaxial growth region (namely, single-crystal silicon) is remarkably lower than that in polysilicon.

However, if the p-type semiconductor substrate 21 is made amorphous in advance by implanting the impurities thereinto, it is possible to form polysilicon during the silicon deposition process by the CVD method. Using the fact that the diffusion rate of the impurities in polysilicon is higher than that in single-crystal silicon (the epitaxial growth film), it is possible to form a shallow junction that is hardly affected by the variations in the film thickness of the deposited polysilicon.

Figure 2:
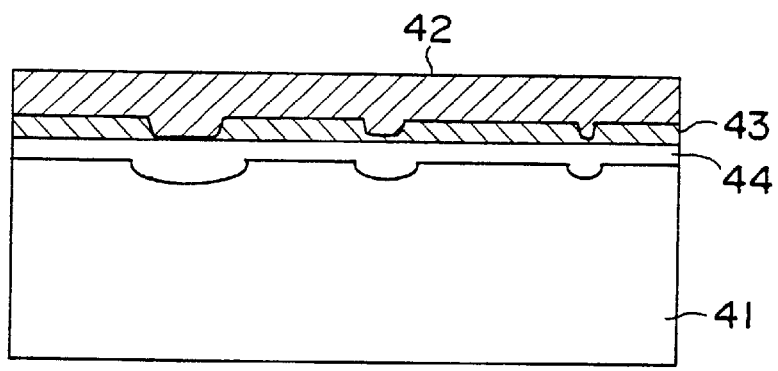
FIG. 2 is an explanatory view showing that native oxide is formed at an interface between a surface of an active region and a polysilicon film.

In the deposition of the polysilicon film of the present embodiment, it is important to deposit it in a manner so as not to form native oxide at an interface between the surface of the active region of the p-type semiconductor substrate 21 and the polysilicon film deposited. In the case where native oxide 43 is formed at an interface between the surface of an active region of a semiconductor substrate 41 and a polysilicon film 42 deposited, as shown in FIG. 2, this native oxide film 43 will serve as a diffusion barrier later when diffusing impurities serving as donors or acceptors into the semiconductor substrate 41 by thermal diffusion, which process is preceded by the introduction of the impurities into the polysilicon film 42 by the ion implantation process, so that the native oxide 43 hinders uniform diffusion of the impurities. As a result, the source/drain junction depth becomes nonuniform, which would cause variations of the transistor characteristics. A reference numeral 44 indicates a source/drain region.

In the present embodiment, use of a low pressure CVD (LPCVD) system equipped with a preliminary vacuum evacuation chamber, a nitrogen purge chamber in which the dew point is kept at −100° C., and a deposition furnace enables the polysilicon film to be deposited without growing native oxide at the interface between the surface of the active region of the p-type semiconductor substrate 21 and the polysilicon film deposited.

Specifically, immediately before the deposition of the polysilicon film, the entire surface of the p-type silicon substrate or wafer 21 is washed with a hydrofluoric acid solution to remove native oxide if any. After that, the resultant silicon wafer is conveyed to the preliminary vacuum evacuation chamber. Next, an atmosphere in which the wafer was conveyed is evacuated once and then replaced with a nitrogen ambient, and the wafer is conveyed to the nitrogen purge chamber in which the dew point is always kept at −100° C. The role of this nitrogen purge chamber is to completely eliminate water molecules adsorbed onto the surface of the wafer by nitrogen purge. Water molecules adsorbed onto the surface of the wafer cannot be eliminated under vacuum and experiments revealed that nitrogen purge can eliminate such water molecules completely.

In an ordinary LPCVD system, a wafer is conveyed to a deposition furnace with water molecules adsorbed onto the surface of the wafer. Usually, deposition of a polysilicon film is carried out at a temperature in the range of about 550° C. to 700° C. For that reason, when the wafer is conveyed to a high-temperature furnace, before a polysilicon film is deposited, oxygen components in the adsorbed water molecules react with the silicon wafer thereby forming native oxide on the surface of the silicon wafer. That is why native oxide exists at an interface between the surface of the active region of the p-type semiconductor substrate 21 and the polysilicon deposited.

On the other hand, in the LPCVD system used in the present embodiment, the silicon wafer is conveyed to the deposition furnace after the adsorbed water molecules are completely eliminated in the nitrogen purge chamber keeping the dew point at −100° C., as described above. Therefore, it is possible to deposit a polysilicon film without the formation of native oxide. In this way, a polysilicon film having a thickness of about 30 nm–500 nm was deposited in the present embodiment.

Thereafter, as shown in FIG. 1(c), the deposited polysilicon is etched back so as to form polysilicon sidewalls 33. In this case, the presence of the insulating film 30 that is a protective layer for the p-type semiconductor substrate 21 and the element isolation regions 22 makes it possible to etch back the polysilicon layer without giving etching induced damage to the p-type semiconductor substrate 21.

Next, as shown in FIG. 1(d), high-concentration n-type impurity ions are implanted into the polysilicon sidewalls 33, and then the n-type impurity ions are diffused also into the p-type semiconductor substrate 21 thus forming source/drain regions 34 including the polysilicon side walls and portions defining junctions in the p-type semiconductor substrate 21. Halo regions 32 are formed at a boundary between the junction-defining portions in the source/drain regions 34 and the channel region in the semiconductor substrate 21. In this case, the above thermal treatment is performed sufficiently so that the impurity ions are diffused to the extent of the width of the polysilicon side wall 33, whereby a source/drain elevated type semiconductor device is completed.

As described above, in the present embodiment, the gate oxide film 23, the gate electrode 24, and the gate cap insulating film 25 are stacked in this order and the insulating sidewall 29 is then formed on both sides thereof in the active region defined by the element isolation regions 22. Then, BF2 ions are implanted into the portions 31 to become the source/drain regions in the p-type semiconductor substrate 21, so as to make the top surface of the p-type semiconductor substrate 21 amorphous. Since the top surface of the p-type semiconductor substrate 21 is made amorphous, polysilicon which favors the formation of a shallow junction is deposited, without the occurrence of the epitaxial growth of the single-crystal silicon, when forming the elevated source/drain regions.

Further, when the surface of the p-type semiconductor substrate is made amorphous, $BF_2$ ions having the opposite conductivity to the source/drain are used. Thus, it is possible to form the halo regions 32 having the function of preventing the short-channel effect, while suppressing the extension of the depletion layer.

Furthermore, before polysilicon is deposited on the p-type semiconductor substrate 21 so as to elevate the source/drain, the wafer is passed through a preliminary vacuum evacuation chamber and then a nitrogen purge chamber in which the dew point is kept at −100° C. In this way, water molecules adsorbed onto the surface of the wafer are eliminated completely. Therefore, native oxide does not grow at the interface between the surface of the active region of the p-type semiconductor substrate 21 and the deposited polysilicon film. Accordingly, when diffusing the impurities, which have been introduced to the polysilicon side walls 33, into the p-type semiconductor substrate 21 by thermal diffusion to form the source/drain regions 34, it is possible to prevent a nonuniform junction depth of the source/drain from occurrence due to native oxide serving as the diffusion barrier. In this way, it is possible to achieve a uniform shallow junction between the source/drain regions 34 and the p-type semiconductor substrate 21.

In the present embodiment, the source/drain implantation is conducted immediately after forming the polysilicon sidewalls 33. However, an annealing process may be added before the source/drain implantation process. The annealing process recovers defects in the p-type semiconductor substrate 21 that occurred during the implantation of $BF_2$ ions for making the p-type semiconductor substrate 21 amorphous, and suppresses diffusion of n-type impurities in the semiconductor substrate 21 during the thermal treatment for the formation of the source/drain regions 34. Therefore, it becomes possible to form a shallower junction.

Moreover, the present invention has the following effects and advantages:

The transistor in the above described embodiment has a gate length of 0.15 μm. As the scale down of elements advances to their gate lengths of 0.1 μm or lower, $BF_2$ ions, which are directed obliquely using the gate electrode as a mask, will be implanted into the whole channel region. As a result, an implantation process which is conducted in order to control the threshold voltage will become unnecessary. In short, in the case of a minute element with a gate length of not more than 0.1 μm, implantation of $BF_2$ ions for suppressing the short-channel effect and the epitaxial growth can serve as an implantation process for controlling the threshold voltage also, and thus the process steps can be reduced. Thus, the advantages of the present invention become eminent as the scale down of elements advances.

Although the present embodiment has been described using as an example an n-channel MOSFET, a p-channel MOSFET can also be formed.

In the present embodiment, implantation of $BF_2$ ions for making the surface of the p-type semiconductor substrate amorphous is performed after forming the insulating sidewalls 29 on the sides of the gate electrode 24, but it is not limited to this. For example, the implantation may be performed after forming the gate electrode 24.

In the present embodiment, the wafer is passed through the nitrogen purge chamber keeping the dew point at −100° C. and water molecules adsorbed onto the surface of the wafer are removed so as not to grow native oxide at the interface between the surface of the active region of the p-type semiconductor substrate 21 and the deposited polysilicon film. However, the method for preventing the growth of the native oxide is not limited to this. What is essential is to deposit polysilicon under an ambient having the oxygen concentration of not more than 1 ppm.

Second Embodiment

Figure 3:
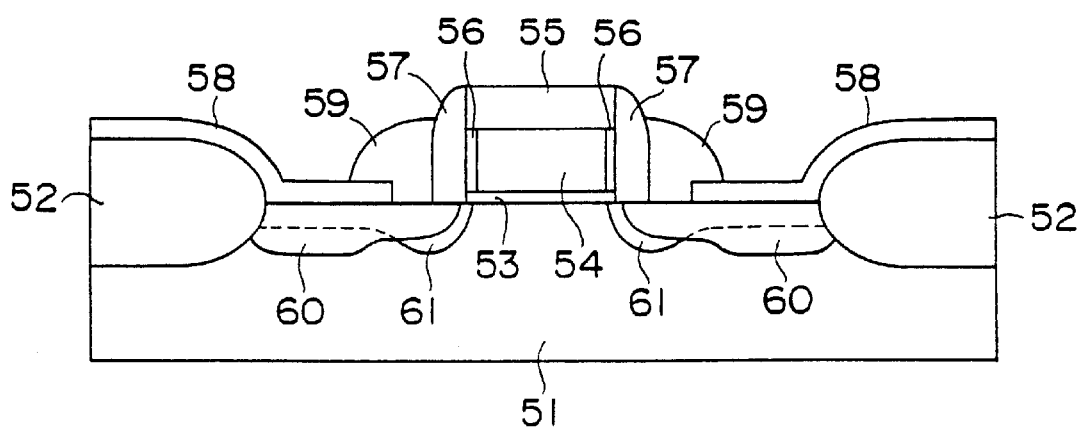
FIG. 3 is a sectional view of an n-channel MOSFET fabricated by the method for producing a semiconductor device shown in FIG. 1.

FIG. 3 is a sectional view of an n-channel MOSFET fabricated by the production method for an n-channel MOSFET described in the first embodiment. In FIG. 3, on an active region delimited by element isolation regions 52 on a p-type semiconductor substrate (or a p-type well region of the semiconductor substrate) 51, a gate oxide film 53, a gate electrode 54, and a gate cap insulating film 55 are stacked. Further, a thermal oxide film 56 is disposed on both sides of the gate electrode 54. Moreover, an insulating sidewall 57 is formed on both sides of a laminate consisting of the gate oxide film 53, the thermal oxide films 56 and the gate cap insulating film 55.

Further, an insulating film 58 is disposed on the element isolation regions 52 and extends toward the active region on the p-type semiconductor substrate 51, and polysilicon sidewalls 59 are disposed outside of the insulating sidewalls 57. The polysilicon sidewalls 59 had n-type high-concentration impurities implanted, and the impurities have been diffused in the p-type semiconductor substrate 51. In this way, elevated source/drain regions are constituted of the polysilicon sidewalls 59 and the n-type high-concentration impurity layers 60 formed under the insulating layers 58 in the active region. Further, between each source/drain region 60 in the active region and the channel region in the p-type semiconductor substrate 51, halo regions 61 that are p-type impurity layers are disposed.

In the above structure, because the source/drain regions 59 are elevated and also the depth of the junction 60 between the source/drain regions and the semiconductor substrate 51 is shallow, even if the thickness of the insulating sidewall 57 is set to a specified value or more enough to suppress increases in leak current and capacitance between the gate electrode 54 and each of the polysilicon sidewalls 59, the short-channel effect is suppressed without increasing the source-drain resistance.

Figure 4:
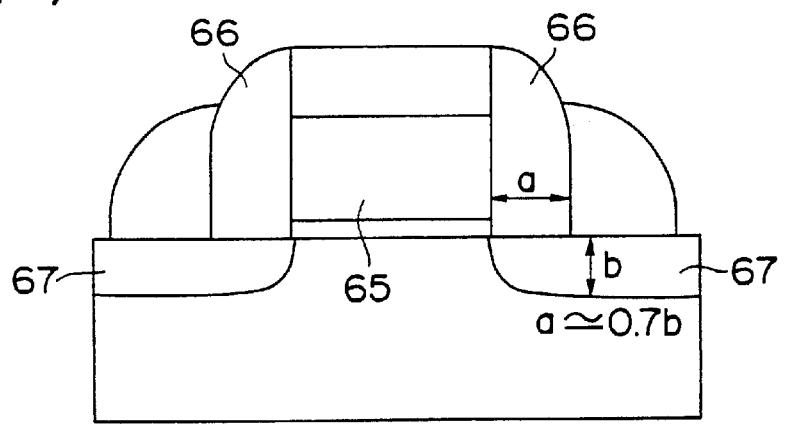
FIG. 4 is a sectional view of a conventional n-channel MOSFET having no halo region.

In a conventional n-channel MOSFET having no halo regions, as shown in FIG. 4, the relationship between the film thickness "a" of a gate electrode insulating sidewall 66 formed on side surfaces of the gate electrode 65, and the junction depth "b" of source/drain regions 67 is approximately 0.7 to 1, provided that the source/drain regions do not constitute an offset structure with respect to the channel. That is, once the film thickness "a" of the gate electrode insulating sidewall 66 is determined, a minimum value of the junction depth "b" is automatically determined.

Incidentally, the short-channel effect dominantly depends on the junction depth "b" of the source/drain regions 67. To suppress the short-channel effect under a certain design rule, the junction depth "b" is univocally determined, and hence the film thickness "a" of the gate electrode insulating sidewall 66 is univocally determined. That is, there is no design freedom. Contrary to this, in the case of the n-channel MOSFET of the present embodiment, the short-channel effect can be controlled by the halo regions 61, and thus it is possible to provide the insulating sidewalls 56, 57 of the gate electrode with design freedom in film thickness.

For example, in the present embodiment, a transistor with a gate length of 0.15 μm is designed. For that gate length, in a conventional transistor shown in FIG. 4, it is required that the junction depth "b" of the source/drain regions 67 be made as shallow as about 30 nm to suppress the short-channel effect. Thus, the film thickness "a" of the gate electrode insulating sidewall 66 is logically about 20 nm or less. On the other hand, in the transistor of the present embodiment, in the case where the impurity concentration of the halo regions 61 is set to $5\times10^{17}/cm^3$–$1\times10^{19}/cm^3$ for example, the film thickness of the insulating sidewalls 56, 57 of the gate electrode can be set to a thickness of about 70 nm. In other words, even if a deeper junction is formed, the short-channel effect can be suppressed. In this case, the capacitance between the gate electrode 54 and each of the elevated source/drain 59 per unit gate width (1 μm) can be reduced to about 0.16 fF, in contrast to a conventional value of 0.37 fF.

Accordingly, by reducing the parasitic capacitance between the gate electrode 54 and the source/drain 59, the capacitance required for charging the n-channel MOSFET in the present embodiment is reduced. Thus, a circuit designed using the n-channel MOSFET of the present embodiment has an improved operation speed.

In the n-channel MOSFET of the present embodiment, the impurity concentration of the p-type semiconductor substrate 51 was $5\times10^{16}/cm^3$–$1\times10^{18}/cm^3$, and the impurity concentration of the n-type source/drain regions 60 was $1\times10^{20}/cm^3$–$1\times10^{22}/cm^3$. The height of the gate electrode 54 and that of the elevated source/drain 59 were 200 nm. The gate electrode insulating sidewall was made up of a 10 nm thick thermal oxide film (silicon oxide film) 56 and a 60 nm thick insulating sidewall (silicon nitride film) 57. For comparison, in the conventional n-channel MOSFET, the gate electrode insulating sidewall 66 was formed of a 10 nm thick silicon oxide film and a 15 nm thick silicon nitride film. In the case of the conventional transistor also, the heights of the gate and the elevated source/drain regions were equal to those of the transistor in the present embodiment, and the capacitances were compared.

Third Embodiment

Figure 5:
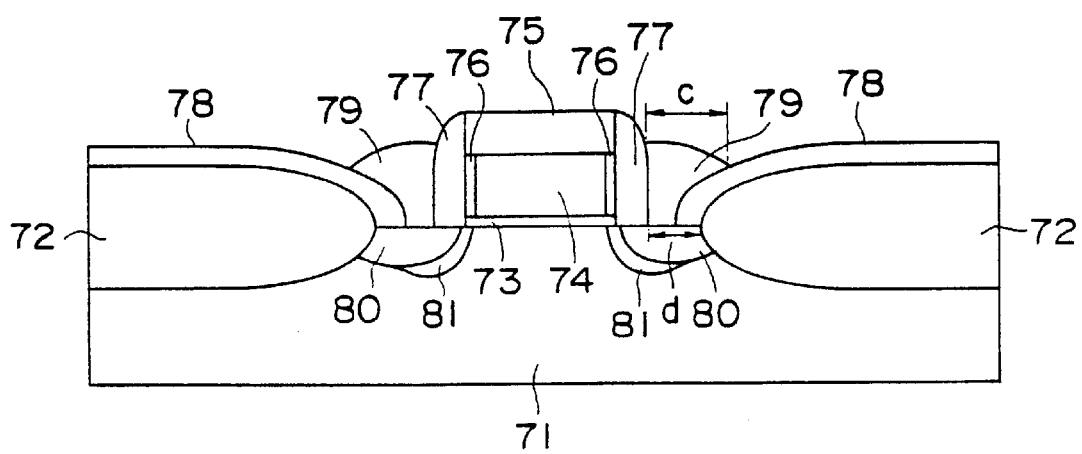
FIG. 5 is a sectional view of an n-channel MOSFET different from FIG. 3.
Figure 6:
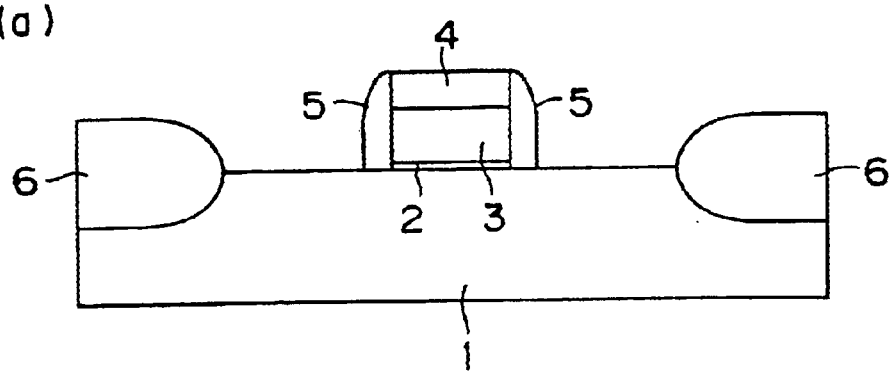
FIG. 6 is a process flow chart which shows a process for fabricating a conventional source/drain elevated type transistor.
Figure 6:
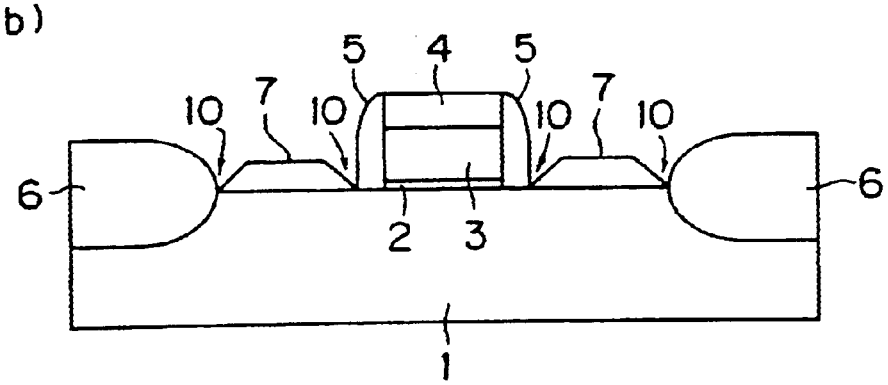
Figure 6:
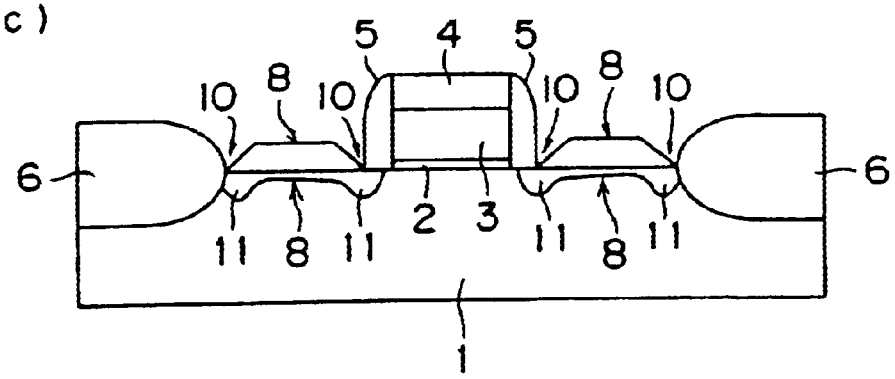

FIG. 5 is a sectional view of an n-channel MOSFET different from that in FIG. 3. In FIG. 5, on each of active regions into which a p-type semiconductor substrate (or a p-type well region) 71 is sectioned or plotted by element isolation regions 72 on the p-type semiconductor substrate (or the p-type well region) 71, a gate oxide film 73, a gate electrode 74, and a gate cap insulating film 75 are provided in a stacked manner. A thermal oxide film 76 is disposed on both sides of the gate electrode 74. Moreover, an insulating sidewall 77 is formed on both sides of a laminate consisting of the gate oxide film 73, the thermal oxide film 76 and the gate cap insulating film 75.

Further, an insulating film 78 is formed on the p-type semiconductor substrate 71 from the element isolation region 72 toward the active region, and a polysilicon sidewall 79, into which the n-type high-concentration impurities have been implanted, is disposed outside of the insulating sidewalls 77. The polysilicon sidewall 79 constitutes an elevated portion of a source/drain region. In the present embodiment, the length "c" on an upper side of the polysilicon sidewall 79 in the longitudinal direction of the gate electrode 74 (namely, the length in a direction perpendicular to the transistor gate width direction=the length in the transistor gate length direction) is longer than the distance between the insulating sidewall 77 and the element isolation region 72 "d". In the active region, source/drain regions 80 that are n-type impurity layers are formed. Between a channel region in the p-type semiconductor substrate 71 and each of the source/drain regions 80 is provided a halo region 81, which is a p-type impurity layer.

As described above, in the present embodiment, the width of the source/drain region 80 inside the semiconductor substrate 71 is shortened, as compared with the n-channel MOSFET of the second embodiment (for example, to 1/9). Therefore, an increase in the capacitance between the source/drain region 80 and the p-type semiconductor substrate 71 or the p-type well region 71 of the semiconductor substrate due to the presence of the halo region 81 can be reduced (for example, to 1/9). Thus, it is possible to suppress an increase in the capacitance. That is, according to the present embodiment, the operation speed is improved as compared with the n-channel MOSFET of the second embodiment.

What is claimed is:

1. A method for producing a semiconductor device, comprising the steps of:

sectioning a surface of a substrate or well region of first conductive type to form an active region and then forming a gate oxide film on the active region;

forming a gate electrode on the gate oxide film;

forming insulating sidewalls on side surfaces of the gate electrode;

implanting ions into a surface of the semiconductor substrate or well region at portions of the active region that are to be source/drain regions, to thereby make theses portions amorphous;

depositing a polycrystalline conductive film on the surface of the semiconductor substrate or well region formed with the gate oxide film, the gate electrode and the insulating sidewalls;

performing etch back on the polycrystalline conductive film to form conductive sidewalls on side surfaces of the insulating sidewalls;

implanting high-concentration impurities of second conductive type into the conductive sidewalls; and diffusing the high-concentration impurities of second conductive type into the semiconductor substrate or well region by a thermal treatment to thereby form the source/drain region.

2. The method for producing a semiconductor device according to claim 1, wherein the ions implanted into the surface of the active region are of the first conductive type and at an impurity concentration higher than that of the first conductive type semiconductor substrate or well region.

3. The method for producing a semiconductor device according to claim 1, wherein the deposition of the polycrystalline conductive film is carried out in an ambient having an oxygen concentration of 1 ppm or lower.

4. A semiconductor device comprising a gate insulating film and a gate electrode stacked in this order on a substrate or well region of first conductive type, sidewall insulating films disposed on side surfaces of the gate electrode, a channel region formed in the semiconductor substrate or well region beneath the gate electrode, and source/drain regions of second conductive type elevated to above the semiconductor substrate or well region from both sides of the channel region, the source/drain regions being electrically isolated from the gate electrode by the gate insulating film and the sidewall insulating films, characterized in that:

the semiconductor substrate or well region has diffusion regions of the first conductive type formed between the source/drain regions and the channel region, the diffusion regions having an impurity concentration higher than that of the semiconductor substrate or well region.

5. The semiconductor device according to claim 4, wherein the impurity concentration of the first conductive type diffusion regions is $5 \times 10^{17}/cm^3 - 1 \times 10^{19}/cm^3$.

6. The semiconductor device according to claim 4, wherein the source/drain regions on the surface of the semiconductor substrate or well region are delimited by element isolation regions; and the elevated source/drain region on the semiconductor substrate or well region has, on an upper side thereof, a length (c) in a transistor gate length direction that is longer than distance (d) between the sidewall insulating film and the element isolation region.

7. The semiconductor device according to claim 4, wherein the elevated second conductive type source/drain regions are made of polysilicon.

8. The semiconductor device according to claim 4, wherein each of the elevated source/drain regions has a portion that is in contact with the corresponding side wall insulating film at a level above the substrate or well region.

* * * * *